US009070577B2

(12) United States Patent
Lee

(10) Patent No.: US 9,070,577 B2
(45) Date of Patent: Jun. 30, 2015

(54) SEMICONDUCTOR DEVICE HAVING FIN STRUCTURE IN PERIPHERAL REGION AND METHOD FOR FORMING THE SAME

(71) Applicant: SK hynix Inc., Icheon-si (KR)

(72) Inventor: Hyun Jin Lee, Seongnam-si (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 14/097,008

(22) Filed: Dec. 4, 2013

(65) Prior Publication Data

US 2014/0177331 A1    Jun. 26, 2014

(30) Foreign Application Priority Data

Dec. 24, 2012  (KR) .......................... 10-2012-0152017

(51) Int. Cl.
| | | |
|---|---|---|
| *H01L 29/00* | (2006.01) | |
| *H01L 27/088* | (2006.01) | |
| *H01L 21/8234* | (2006.01) | |
| *H01L 29/66* | (2006.01) | |
| *H01L 29/417* | (2006.01) | |
| *H01L 27/108* | (2006.01) | |
| *G11C 11/4097* | (2006.01) | |

(52) U.S. Cl.
CPC .... *H01L 27/0886* (2013.01); *H01L 21/823431* (2013.01); *H01L 29/66795* (2013.01); *H01L 29/41791* (2013.01); *H01L 27/10879* (2013.01); *G11C 11/4097* (2013.01)

(58) Field of Classification Search
CPC ................. H01L 29/66795; H01L 21/823431; H01L 27/0886; H01L 27/10879; H01L 29/41791
See application file for complete search history.

(56) References Cited

U.S. PATENT DOCUMENTS

| | | | |
|---|---|---|---|
| 8,759,899 B1 * | 6/2014 | Lue et al. ...................... 257/315 |
| 2007/0235785 A1 * | 10/2007 | Kahng et al. .................. 257/297 |
| 2007/0298599 A1 | 12/2007 | Jang et al. | |
| 2011/0151633 A1 * | 6/2011 | Park et al. ..................... 438/270 |
| 2011/0189830 A1 * | 8/2011 | Oshima ......................... 438/270 |
| 2011/0237037 A1 * | 9/2011 | Park et al. ..................... 438/270 |
| 2012/0091554 A1 | 4/2012 | Lee | |
| 2012/0129301 A1 * | 5/2012 | Or-Bach et al. ............... 438/129 |
| 2013/0020707 A1 * | 1/2013 | Or-Bach et al. ............... 257/741 |
| 2013/0052781 A1 * | 2/2013 | Dai et al. ...................... 438/275 |

FOREIGN PATENT DOCUMENTS

| | | |
|---|---|---|
| KR | 10-0739656 B1 | 7/2007 |
| KR | 10-2011-0060744 A | 6/2011 |
| KR | 10-2012-0012224 A | 2/2012 |
| KR | 10-2012-0039390 A | 4/2012 |

* cited by examiner

*Primary Examiner* — Ngan Ngo

(57) ABSTRACT

In order to fabricate a semiconductor device, a semiconductor substrate in a peripheral region is etched to form a plurality of holes. A gap-filling material is buried in the holes of the semiconductor substrate in the peripheral region, and first and second device isolation films are formed in the semiconductor device. A fin structure is formed by recessing the gap-filling material, and a gate is formed over a surface including the fin structure. As a result, operation characteristics of transistors formed in the peripheral region are improved and the short channel effects are also reduced.

20 Claims, 12 Drawing Sheets

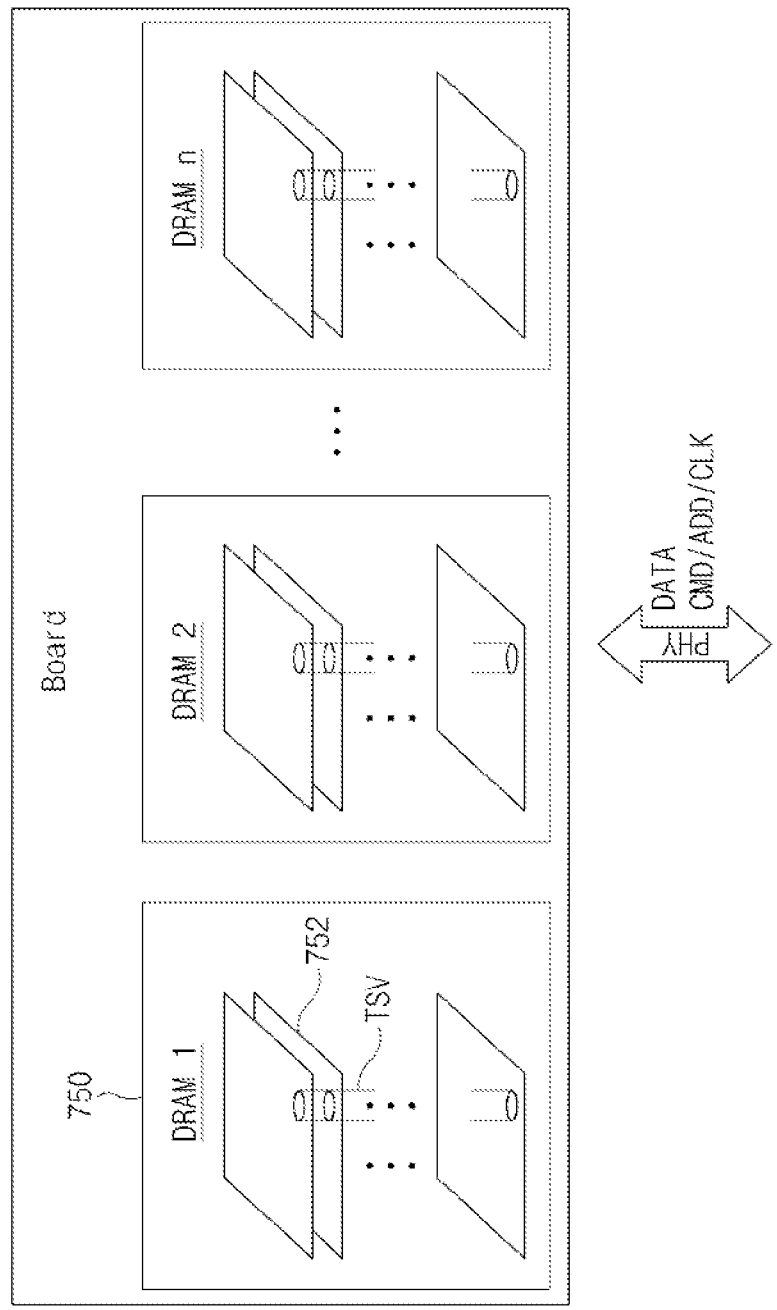

SEMICONDUCTOR DEVICE HAVING FIN STRUCTURE IN PERIPHERAL REGION AND METHOD FOR FORMING THE SAME

CROSS-REFERENCE TO RELATED APPLICATION

The priority of Korean patent application No. 10-2012-0152017 filed on 24 Dec. 2012, which is incorporated by reference herein in its entirety, is claimed.

BACKGROUND

A conventional method for forming a gate over a semiconductor substrate in a transistor includes doping impurities into both sides of the gate to form a source and a drain. In order to increase a data storage capacity while decreasing a size of semiconductor memory device, the size of each unit cell in the device is decreased.

In addition, as a result, a design rule of the capacitor and a cell transistor included in the unit cell have also been made smaller. However, such a smaller design rule applied to cell transistors has resulted in undesirable effects such as short channel effects, Drain Induced Barrier Lower (DIBL), and the like due to a decreased channel length of the cell transistor. Thus, operation of the cell transistor has become less reliable. Some of the issues caused by the decreased channel length may be relieved by maintaining a threshold voltage of the cell resistor at a substantially constant level, so that the cell transistor performs a normal operation. For example, as a channel length of the transistor decreases, a concentration of the impurities doped into a region in which the channel is formed may be increased to maintain the threshold voltage substantially constant.

However, when the design rule is 100 nm or less, if the concentration of the impurities doped into the channel region is increased, an electric field of a Storage Node (SN) junction is increased, thereby deteriorating the refresh characteristics of a semiconductor memory device.

SUMMARY

Various embodiments of the present invention are directed to providing a semiconductor device and a method for forming the same that substantially obviate one or more disadvantages of the related art. In order to address problems associated with shorter channel lengths, in an embodiment according to the present invention a cell transistor having a three-dimensional channel structure in which a channel extends in a vertical direction is used, so that the channel length of the cell transistor is maintained even when the design rule becomes smaller Embodiments of the present disclosure relate to a semiconductor device and a method for forming the same in which a semiconductor substrate of a peripheral region is etched to form a plurality of holes; a gapfill material is buried in the holes of the peripheral region; first and second device isolation regions are formed; a fin structure is formed by recessing the gapfill material; and a gate is formed over the entire surface including the fin structure, such that the operation characteristics of transistors of the peripheral region are improved and the short channel effect characteristics are also improved.

In an embodiment, a method for forming a semiconductor device includes: forming a semiconductor substrate including a peripheral region; forming a first device isolation region and a second device isolation region by etching the semiconductor substrate; forming an insulation film in the first and second device isolation regions; forming a fin-type active region by etching the insulation film to partially expose an upper part and sidewall of the active region; and forming a line-type gate pattern over the fin-type active region. The first and second device isolation regions are formed simultaneously. The second device isolation region has a larger width than a first width of the first device isolation region and the first width of the first device isolation region is parallel to the width of the second device isolation region. The forming the fin-type active region includes etching the insulation film using a line-type mask as an etch mask to partially expose the top and sidewall surfaces of the active region. A width of the line-type mask is smaller than a second width of the first device isolation region. The first device isolation regions are each formed to have an island shape. The gate is formed over the insulation film in the first device isolation region and the fin-type active region, and has a line shape. The insulation film in the first device isolation region is formed of a laminate structure of a sidewall oxide film and a liner insulation film, and the liner insulation film comprises a nitride film. The insulation film in the second device isolation region is formed of a laminate structure of a sidewall oxide film, a liner insulation film, and a Spin On Dielectric (SOD) film, and the liner insulation film comprises a nitride film. After the formation of the gate, a plurality of contact plugs over portions of the active region outside the fin-type active region is formed. The plurality of contact plugs is formed on opposing sides of the gate. A width of the gate is larger than a second width of first device isolation regions and the width of the gate is perpendicular to a longitudinal direction of the gate. The second width of the first device isolation regions is parallel to the width of the gate.

In an embodiment, a semiconductor device includes: a semiconductor substrate including a peripheral region; an active region, a first device isolation region, and a second device isolation region which are formed in the semiconductor substrate of the peripheral region; an insulation film formed in the first and second device isolation regions; a fin-type active region formed to partially expose an upper part and sidewall of the active region; and a line-type gate pattern formed over the fin-type active region.

In an embodiment, an electronic device includes: a memory device configured to store data and read the stored data in response to a data input/output (I/O) control signal; and a memory controller configured to generate the data I/O control signal, and control data I/O operations of the memory device. The memory device includes:
a semiconductor substrate including a peripheral region; an active region, first device isolation regions, and a second device isolation region formed in the semiconductor substrate of the peripheral region, the active region comprising a fin-type active region that corresponds to top and sidewall surfaces of the active region; an insulation film formed in the first and second device isolation regions; and a gate formed over the fin-type active region.

It is to be understood that both the foregoing general description and the following detailed description of the present disclosure are for illustrative and explanatory purposes and are intended to provide further explanation of the invention as claimed.

BRIEF DESCRIPTION OF THE DRAWINGS

FIGS. 7A and 7B illustrate various examples of the memory device 630 shown in FIG. 6.

DESCRIPTION OF EMBODIMENTS

Reference will now be made in detail to embodiments of the present disclosure, examples of which are illustrated in the accompanying drawings. Wherever possible, the same reference numbers will be used throughout the drawings to refer to the same or like parts. A semiconductor device and a method for forming the same according to embodiments of the present disclosure will hereinafter be described with reference to the appended drawings.

Figure 1:
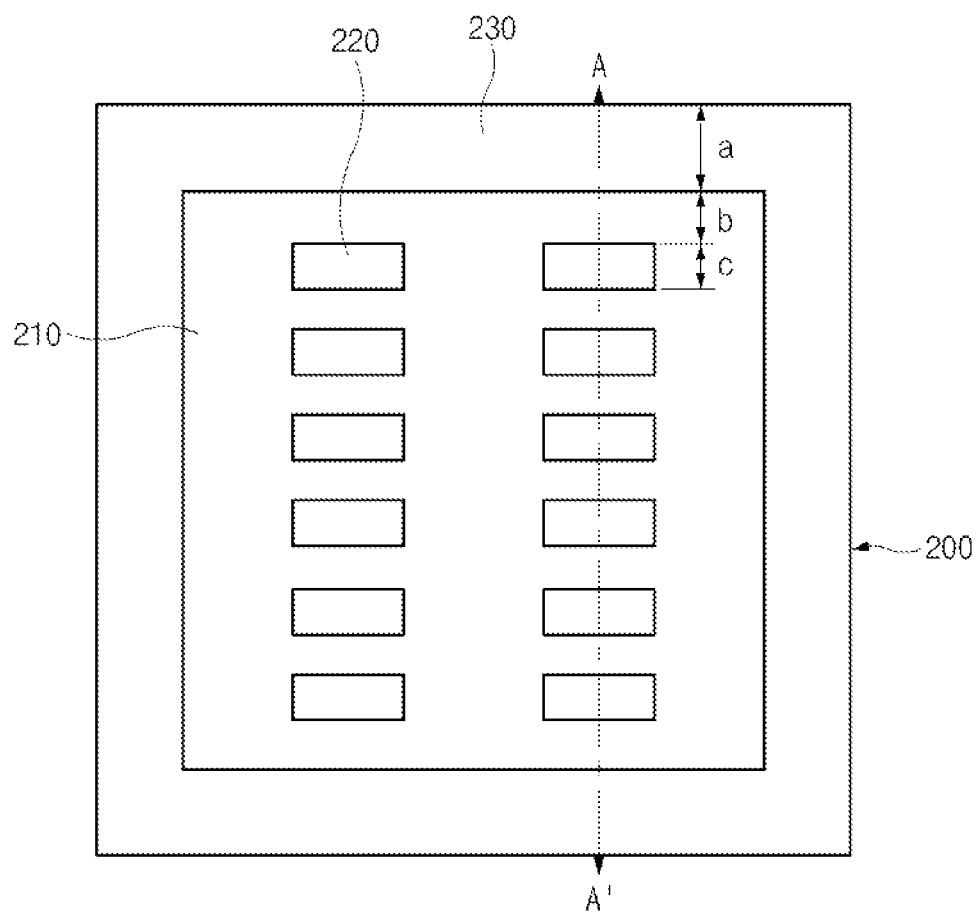
FIG. 1 shows a semiconductor device and a method for forming the same according to an embodiment.

FIG. 1 shows a semiconductor device and a method for forming the same according to an embodiment.

Referring to FIG. 1, an active region 210 of a peripheral (Peri) region, a first device isolation region 220, and a second device isolation region 230 are shown. The first device isolation region 220 is formed to have an island shape. In addition, the active region 210 comprises a plurality of first device isolation regions 220 arranged as shown in FIG. 1. In addition, the second device isolation region 230 is formed at the outermost side of each of the active regions 210, such that it may separate or isolate active region 210. In order to explain how the above-mentioned regions are arranged in more detail, a width of the second device isolation region 230 contacting the active region 210 is denoted by 'a', and a distance within the active region 210 between the second device isolation region 230 and the first device isolation region 220 that is the closest to the second device isolation region 230 is denoted by 'b'. In addition, a width of a first device isolation region 220 is denoted by 'c'.

FIGS. 2A to 2D are cross-sectional views illustrating a semiconductor device and a method for forming the same according to an embodiment. Specifically, FIGS. 2A to 2D are cross-sectional views illustrating the semiconductor device of FIG. 1 taken along the line A-A'.

Figure 2A:
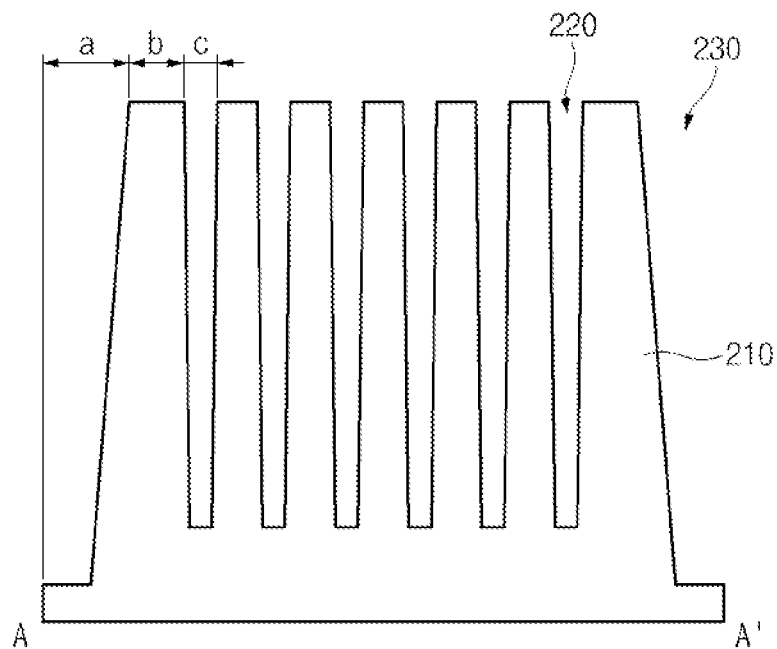
FIGS. 2A to 2D are cross-sectional views illustrating a semiconductor device and a method for forming the same according to an embodiment.

Referring to FIG. 2A, after a photoresist film (not shown) is deposited over a semiconductor substrate 200 in the Peri region, a photoresist pattern (not shown) is formed by an exposure and development process using a mask configured to define first device isolation regions 220 and a second device isolation region 230. Subsequently, the semiconductor substrate is etched using the photoresist pattern as an etch mask so that the first device isolation regions 220 and the second device isolation region 230 are formed to define the active region 210. Here, a width of the second device isolation region 230 is denoted by 'a', and a distance in the active region 210 between the second device isolation region 230 and the first device isolation region 220 that is the closest to the second device isolation region 230 is denoted by 'b'. In addition, a first width of each first device isolation region 220 is denoted by 'c'.

As shown in FIG. 2A, the width (a) of the second device isolation region 230 may be larger than the first width (c) of a first device isolation region 220. In an embodiment, the second device isolation region 230 and the first device isolation regions 220 may be simultaneously formed using a common etch mask. In another embodiment, the first device isolation regions 220 and the second device isolation region 230 may be formed separately using different etch masks. In an embodiment, a semiconductor substrate in a cell region and a semiconductor substrate in the Peri region may be etched at the same time.

Figure 2B:
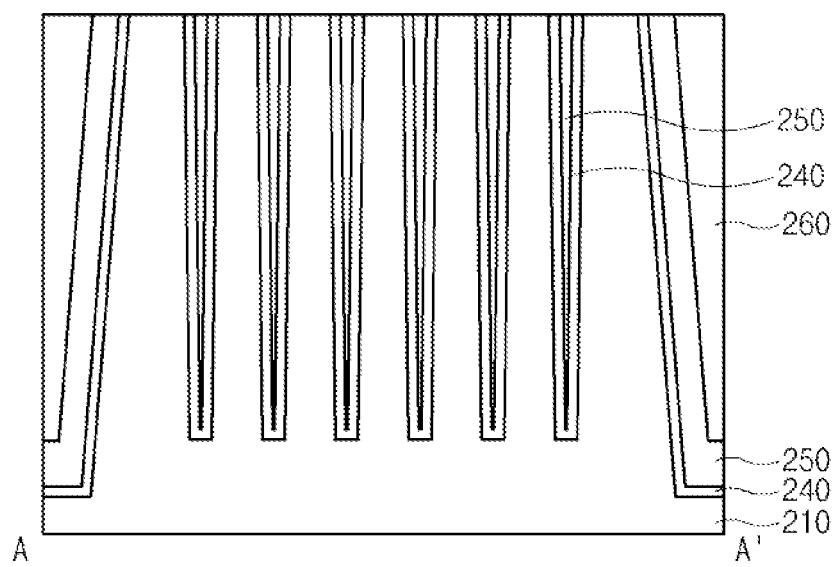

Referring to FIG. 2B, after completion of wall oxidation, a sidewall oxide film 240 is first formed over bottom and sidewall surfaces of the first and second device isolation regions 220 and 230. A liner nitride film 250 and a liner oxide film (not shown) are sequentially formed over an entire surface of the substrate 200 including the first and second device isolation regions 220 and 230 in which the sidewall oxide film 240 has been formed. The liner nitride film 250 may reduce stress applied to the semiconductor substrate 200 so that it can improve refresh characteristics.

Moreover, the liner nitride film 250 formed in the first device isolation region 220 may apply a tensile or a compressive stress to a portion of the active region 210 in which a channel is formed in a transistor in the Peri region. When such a stress is applied, the mobility of electrons or holes flowing through the channel is increased. Accordingly, a current flowing through the channel is also increased. As a result, performance of the transistor (e.g., an on/off switching speed) in the Peri region is improved. The liner oxide film (not shown) prevents the liner nitride film 250 from being oxidized and etched before an insulation film 260 (e.g., a high density plasma (HDP) film or a spin on dielectric (SOD) film) is deposited.

After the insulation film 260 is deposited over the second device isolation regions 230, a planarization process (e.g., Chemical Mechanical Polishing) is performed until top portions of the active region 210 are exposed. For example, the insulation film 260 includes an SOD film. Although not shown, the insulation film 260 may be deposited over the first device isolation region 220.

Figure 2C:
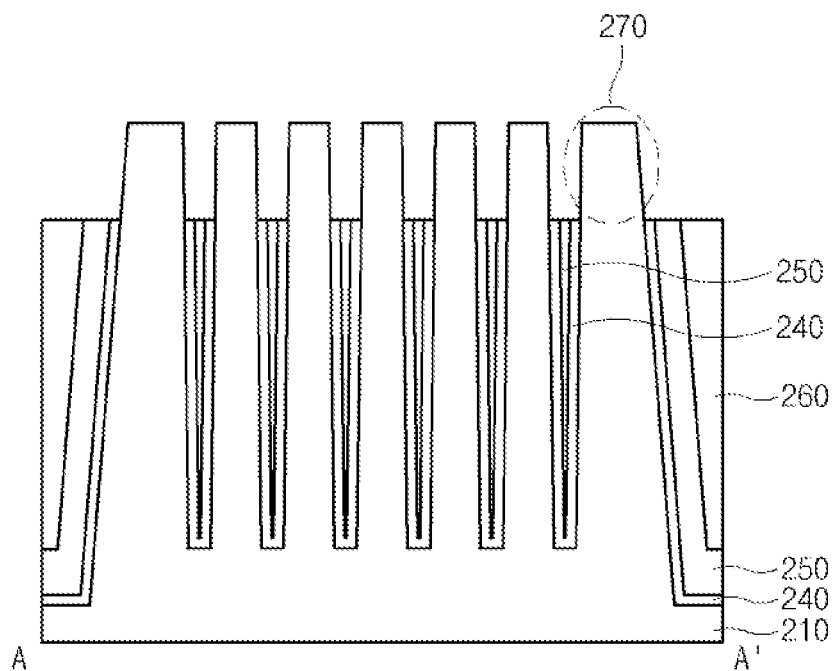

Referring to FIG. 2C, the insulation film 260, the liner nitride film 250, and the sidewall oxide film 240 are partially etched using a mask 265 (see FIG. 3) to form a fin-type active region 270. The mask 265 including exposure patterns(X) and shading patterns(Y) is formed to have a line structure.

In an embodiment, a vertical cross-section of the fin-type active region 270 has a trapezoidal shape, and a channel may be formed below exposed fin-type active region 270 to have a 3D structure. In addition, the fin-type active region 270 may be etched so long as its own sidewalls remain, so that a height or depth of the fin-type active region 270 as well as an etch depth can be adjusted. As a result, the operation characteristics of the transistor are improved.

As shown in FIG. 2C, the etching process for partially exposing top and sidewall surfaces of the active region 210 to form the fin-type active region 270 is similar to a conventional process for forming a fin structure (fin-type active region 270). However, contrary to conventional processes, the mask 265 (FIG. 3) has a line structure, and a width (d) perpendicular to a longitudinal direction of the mask 265 may be narrower than a second width (f) of each first device isolation region 220 (see FIG. 3). Here, since the width (d) of the mask 265 is narrower than the second width (f) of each first device isolation region 220 and the fin-type active region 270 is formed using the mask 265, the fin-type active region 270 is not formed in portions of the active region 210 where a source or a drain are formed (source/drain region). Instead, the fin-type active region 270 is formed in portions of the active region 210 covered by the mask 265.

On the other hand, when a conventional process of forming a fin structure is performed, the fin structure is formed in a region including the source/drain region. As a result, a source/drain mismatch issue may arise from the fin structure formed in the source/drain region. By forming a fin structure, e.g., the fin-type active region 270, in the portions of the active region 210 covered by the mask 265, the source/drain mismatch issue can be avoided.

Figure 2D:
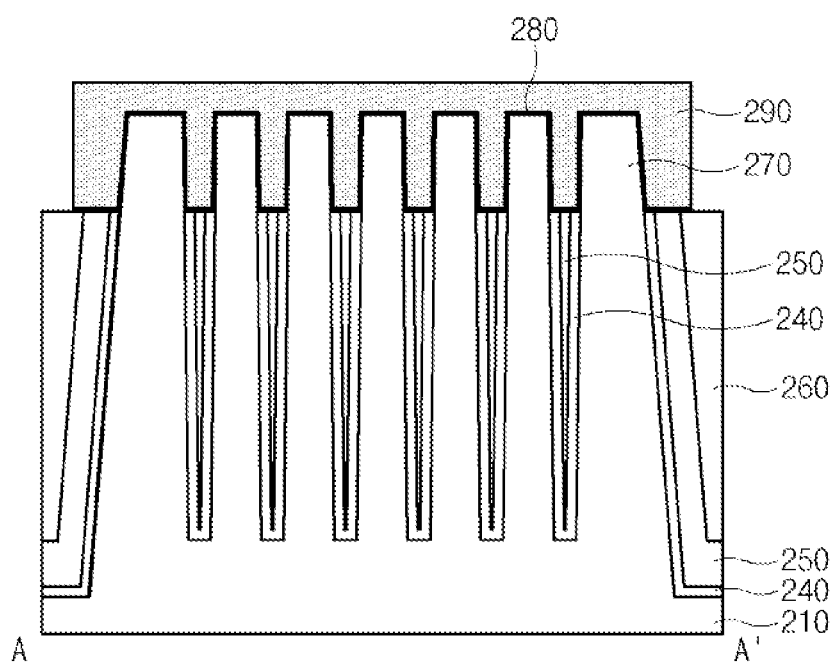

Referring to FIG. 2D, a gate insulation film 280 and a gate 290 are sequentially formed over the fin-type active region 270, the exposed insulation film 260, the liner nitride film 250, and the sidewall oxide film 240. In an embodiment, the gate insulation film 280 includes an oxide film.

Figure 3:
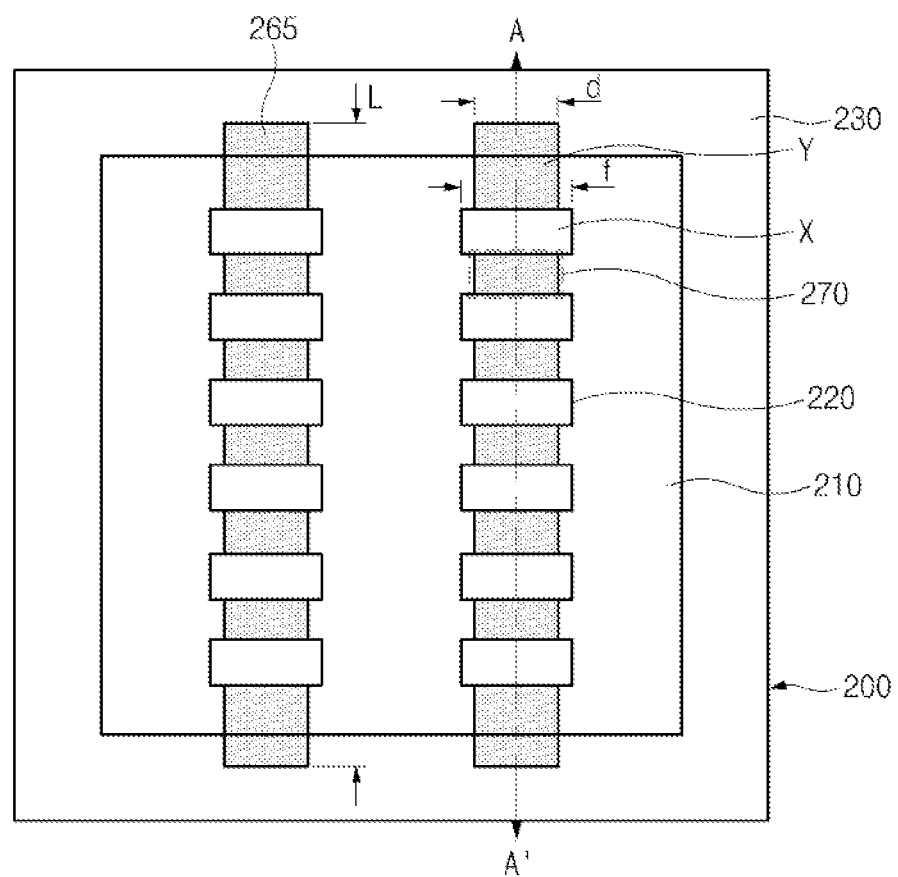
FIGS. 3 and 4 are plan views illustrating a semiconductor device and a method for forming the same according to an embodiment.

Subsequently, a gate 290 may be formed to have a line structure extending in substantially the same direction as that of the mask 265 of FIG. 3. A width (e) perpendicular to a longitudinal direction of the gate 290 may be larger than the second width (f) of each first device isolation region 220 (See FIG. 4).

Figure 4:
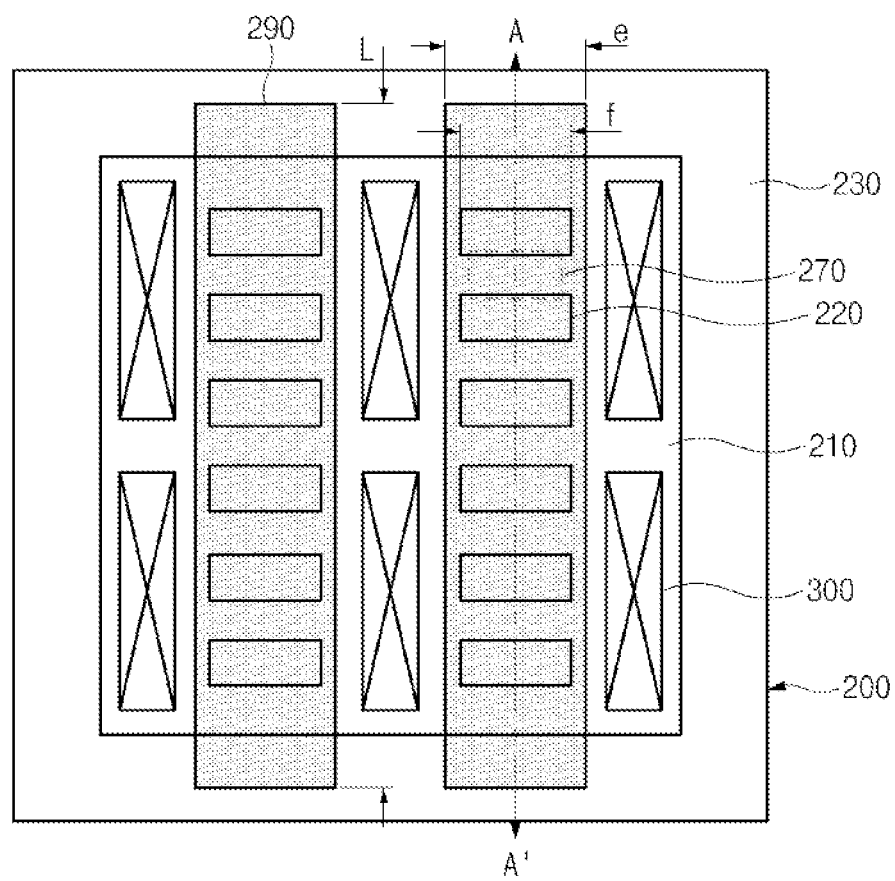

Subsequently, the fin-type active region 270 may be coupled to a contact plug 300. In an embodiment, the contact plug 300 is formed over a portion of the active region 210 outside the fin-type active region 270. For example, a plurality of the contact plugs 300 may be formed near sides of the gate 290 as shown in FIG. 4.

Thereafter, a gate spacer (not shown) is formed at both sidewalls of the gate 290, and then an ion implantation process is performed to form a source/drain region (not shown). In an embodiment, the source/drain region may be formed to have an elevated source/drain (ESD) structure.

Figure 5:
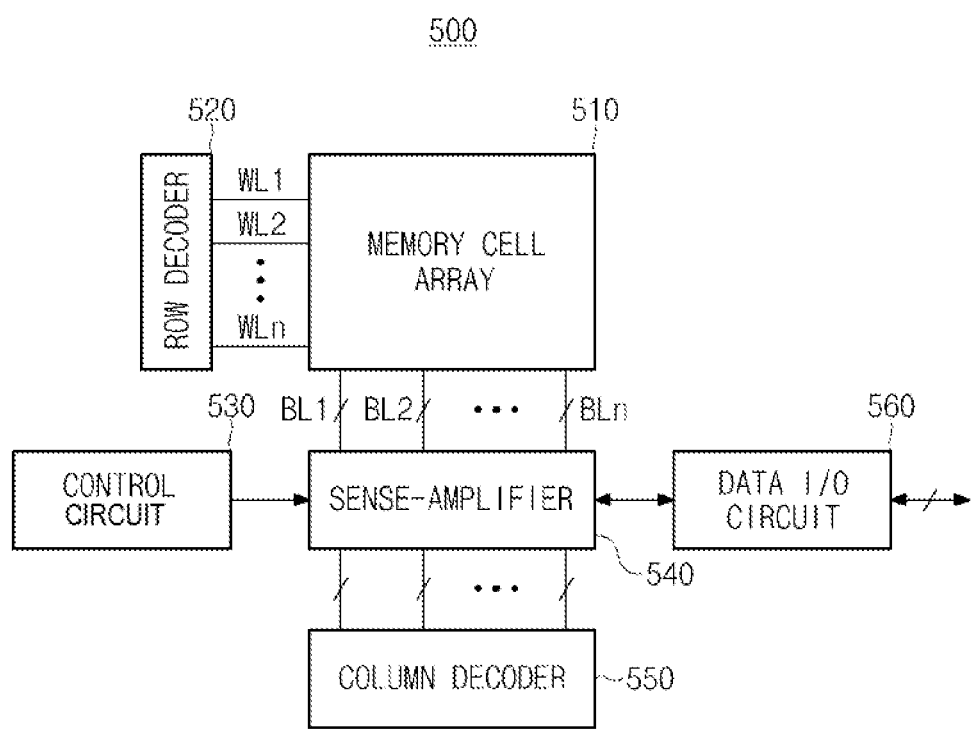
FIG. 5 is a block diagram illustrating a memory device according to an embodiment.

FIG. 5 is a block diagram illustrating a memory device according to an embodiment.

Referring to FIG. 5, the memory device 500 includes a memory cell array 510, a row decoder 520, a control circuit 530, a sense-amplifier (sense-amp) 540, a column decoder 550, and a data Input/Output (I/O) circuit 560.

The memory cell array 510 includes a plurality of word lines (WL1~WLn) (where 'n' is a natural number), a plurality of bit lines (BL1~BLn), and a plurality of memory cells (not shown) interconnected between the word lines (WL1~WLn) and the bit lines (BL1~BLn). Here, the memory cells (not shown) are arranged in the form of a matrix. Each memory cell includes a transistor serving as a switching element that is turned on or off in response to a voltage applied to the word lines (WL1~WLn), and each transistor includes a gate (not shown) and a source/drain region (junction region) (not shown).

The embodiment includes gate over the fin structure in the peripheral region so as to improve an operation characteristics of transistors formed in the peripheral region as well as to reduce the short channel effects.

The row decoder 520 generates a word line selection signal (row address) for selecting a memory cell in which data is to be read or written, and outputs the word line selection signal to the word lines (WL1~WLn) so as to select any one of the word lines (WL1~WLn).

A control circuit 530 controls the sense-amplifier 540 in response to a control signal (not shown) received from an external part.

The sense-amplifier 540 may sense/amplify data of each memory cell, and may store data in each memory cell. In this case, the sense-amplifier 540 may include a plurality of sense-amplifiers (not shown) for sensing/amplifying data corresponding to a plurality of bit lines (BL1~BLn), and each sense-amplifier may sense/amplify data of the plurality of bit lines (BL1~BLn) in response to a control signal generated from the control circuit 530. The sense-amplifiers are respectively configured to sense/amplify data pieces of the bit lines (BL1~BLn) in response to the control signal generated from the control circuit 530.

The column decoder 550 generates column selection signals for operating the sense-amplifiers coupled to cells selected by the row decoder 520, and outputs the column selection signals to the sense-amplifier 540.

The data Input/Output (I/O) circuit 560 may transmit write data received from an external part to the sense-amplifier 540 in response to a plurality of column selection signals generated from the column decoder 550, and may output read data sensed/amplified by the sense-amplifier 540 to the external part in response to the column selection signals generated from the column decoder 550.

The row decoder 520, the control circuit 530, the sense-amplifier 540, and the column decoder 550 from among the constituent elements of the above-mentioned memory device 500 may be substantially identical to those of the conventional memory device.

As described above, the gate over the fin structure in the peripheral region is applied to a cell transistor of the memory device 500, such that operation characteristics of transistors formed in the peripheral region are improved and the short channel effects are also reduced, resulting in improved operation characteristics of the memory device 500.

Figure 6:
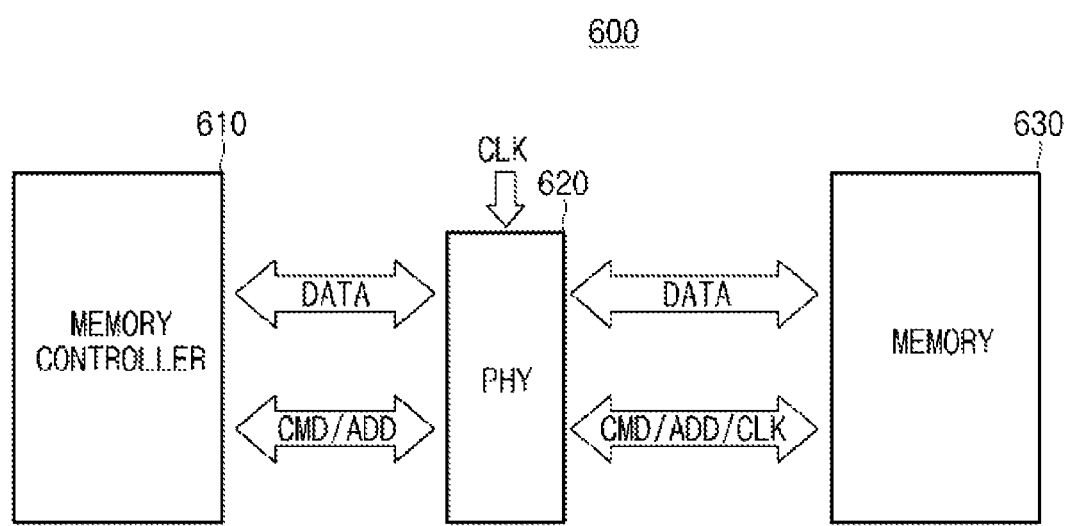
FIG. 6 is a block diagram illustrating an electronic device including a memory device according to an embodiment.

FIG. 6 is a block diagram illustrating an electronic device including a memory device according to an embodiment.

Referring to FIG. 6, the electronic device 600 may include a memory controller 610, a memory interface (PHY) 620, and a memory device 630.

The memory controller 610 generates data I/O control signals (command signal (CMD), address signal (ADD), etc.) for controlling the memory device 630, outputs the data I/O control signals to the memory device 630 through the memory interface 620, and thus controls data I/O operations (also called data Read/Write operations') of the memory device 630. The memory controller 610 may include a control unit for controlling a general data processing system to input/output data to/from the memory devices. The memory controller 610 may be embedded in a processor of electronic devices (for example, a Central Processing Unit (CPU), an Application Processor (AP), a Graphic Processing Unit (GPU), etc.), or may be configured in the form of a System on Chip (SoC) and be fabricated in one chip along with the processors. Although the memory controller 610 of FIG. 6 is denoted by one block, the memory controller 610 may include a controller of a volatile memory and a controller of a non-volatile memory.

The memory controller 610 may include a conventional controller for controlling a variety of memories. For example, the conventional controller may control Integrated Device Electronics (IDE), Serial Advanced Technology Attachment (SATA), Small Computer System Interface (SCSI), Redundant Array of Independent Disks (RAID), Solid State Disc (SSD), External SATA (eSATA), Personal Computer Memory Card International Association (PCMCIA), Multi Media Card (MMC), Embedded MMC (eMMC), Compact Flash (CF), Graphic Card, etc.

The memory interface 620 may provide a physical layer interface between the memory controller 610 and the memory device 630, and may process a timing point of data communicated between the memory controller 610 and the memory device 630 in response to a clock signal (CLK).

The memory device 630 may include a plurality of memory cells for storing data therein, store data (DATA) or read the stored data (DATA) upon receiving control signals (CMD, ADD) from the memory controller 610 through the memory interface 620, and then output the read data to the memory interface 620.

The memory device 630 may include a non-volatile memory and a volatile memory. The volatile memory may include a Dynamic Random Access Memory (DRAM), a Mobile DRAM, a Static Random Access Memory (SRAM), etc. The non-volatile memory may include a Nor Flash Memory, a NAND Flash Memory, a Phase Change Random Access Memory (PRAM), a Resistive Random Access Memory (RRAM), a Spin Transfer Torque Random Access Memory (STTRAM), a Magnetic Random Access Memory (MRAM), etc. In addition, the memory device 630 shown in FIG. 6 is denoted by only one block, and may include a plurality of memory chips. If the memory device 630 is comprised of a plurality of memory chips, the memory chips may be stacked on a substrate (board) or may be mounted in a planar fashion onto the substrate (board).

As described above, the gate over the fin structure in the peripheral region is applied to a cell transistor of the memory device 630 for use in the electronic device 600, such that operation characteristics of transistors formed in the peripheral region are improved and the short channel effects are also reduced, resulting in improved operation characteristics of the electronic device.

Figure 7A:
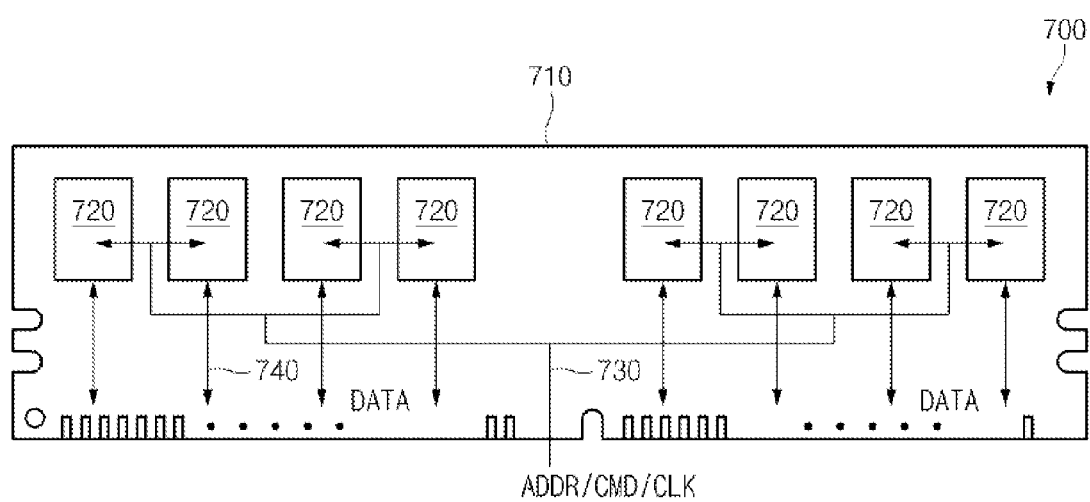

FIGS. 7A and 7B illustrate various examples of the memory device 630 shown in FIG. 6.

Referring to FIG. 7A, several memory chips 720 are mounted to a module substrate 710 in such a manner that the memory chips 720 can be inserted into memory slots of a computer.

The semiconductor module 700 includes a plurality of memory chips 720 mounted to a module substrate 710, a command link 730 for receiving signals (ADDR, CMD, and CLK) controlling the memory chips 720, and a data link 740 for receiving I/O data of the memory chips 720.

Here, each memory chip 720 may include the memory device 500 shown in FIG. 5.

Although FIG. 7A exemplarily shows that memory chips 720 are mounted only at the front surface of the module substrate 710, it should be noted that the memory chips 720 can also be mounted to a back surface of the module substrate 710 without departing from the scope of the embodiment. In this case, the number of memory chips 720 mounted to the module substrate 710 is not limited only to the example of FIG. 7A. In addition, a material and structure of the module substrate 710 are not specially limited.

FIG. 7B illustrates another example of the memory device shown in FIG. 6.

Referring to FIG. 7B, the memory device 750 may be implemented by stacking/packaging a plurality of semiconductor layers (semiconductor chips) 752, and at least one memory device 750 may be mounted to a board (substrate) and operate in response to a control signal of the memory controller 610. In this case, the memory device 750 may include a specific structure in which the same semiconductor layers (chips) are interconnected through a through silicon via (TSV), or may include another structure in which heterogeneous semiconductor layers (chips) are interconnected through a TSV. Although FIG. 7B illustrates that signal transmission between semiconductor layers is achieved through a TSV for convenience of description, the scope or spirit of the embodiment is not limited thereto.

Figure 8:
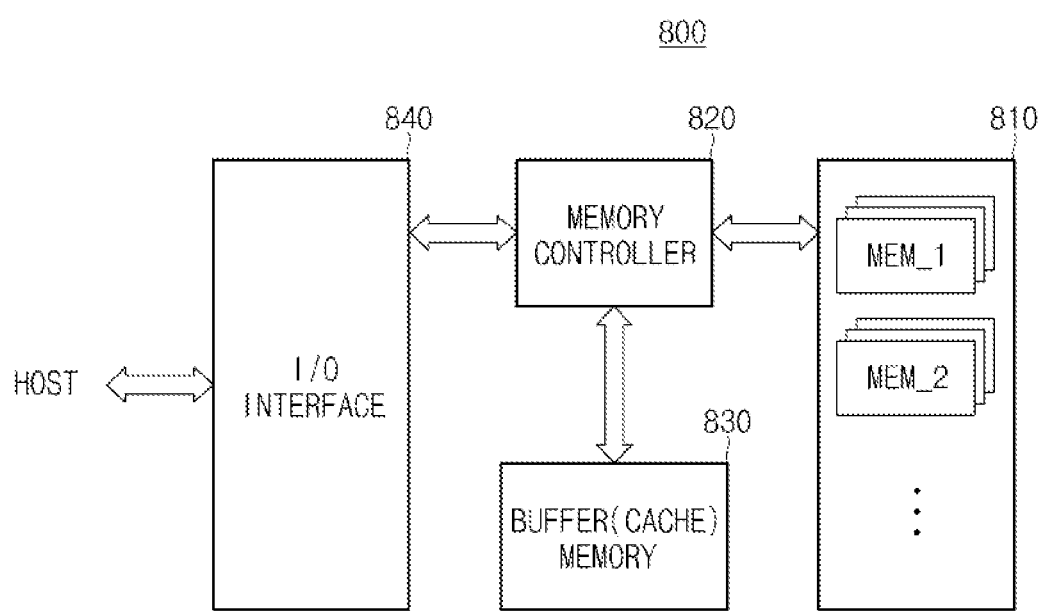
FIG. 8 is a block diagram illustrating an electronic device according to another embodiment.

FIG. 8 is a block diagram illustrating an electronic device according to another embodiment.

Referring to FIG. 8, the electronic device 800 may include a data storage unit 810, a memory controller 820, a buffer (cache) memory 830, and an I/O interface 840.

The data storage unit 810 may store data received from the memory controller 820 upon receiving a control signal from the memory controller 820, read the stored data, and output the read data to the memory controller 820. The data storage unit 810 may include various non-volatile memory units having data to remain unchanged when powered off, for example, a Nor Flash Memory, a NAND Flash Memory, a Phase Change Random Access Memory (PRAM), a Resistive Random Access Memory (RRAM), a Spin Transfer Torque Random Access Memory (STTRAM), a Magnetic Random Access Memory (MRAM), etc.

The memory controller 820 may decode a command received from an external device (host device) through an I/O interface 840, and may control data I/O actions of the data storage unit 810 and the buffer memory 830. The memory controller 820 may include the memory controller 610 shown in FIG. 6. Although the memory controller 820 is denoted by one block as shown in FIG. 8 for convenience of description, the memory controller 820 may include a first controller for controlling a non-volatile memory 810 and a second controller for controlling the buffer memory 830 serving as a volatile memory. Here, the first controller and the second controller may be arranged independently from each other.

The buffer memory 830 may temporarily store data to be processed by the memory controller 820. In other words, the buffer memory 830 may temporarily store data to be input/output to/from the data storage unit 810. The buffer memory 830 may store data received from the memory controller 820 upon receiving a control signal from the memory controller 820, read the stored data, and output the read data to the memory controller 820. The buffer memory 830 may include a volatile memory, for example, a Dynamic Random Access Memory (DRAM), a Mobile DRAM, a Static Random Access Memory (SRAM), etc.

The I/O interface 840 may provide a physical connection between the memory controller 820 and the external device (host device), such that the I/O interface 840 may control the memory controller 820 to receive data I/O control signals from the external device as well as to exchange data with the external device. The I/O interface 840 may include at least one of various interface protocols, for example, a universal serial bus (USB) protocol, a multimedia card (MMC) protocol, a peripheral component interconnection (PCI) protocol, a PCI-express (PCI-E) protocol, a serial attached SCSI (SAS), a serial ATA (SATA) protocol, a parallel advanced technology attachment (PATA) protocol, a small computer small interface (SCSI) protocol, an enhanced small disk interface (ESDI) protocol, and an integrated drive electronics (IDE) protocol.

The electronic device 800 shown in FIG. 8 may be used as an auxiliary memory device or an external storage device of the host device. The electronic device 800 may include a Solid State Disc (SSD), a Universal Serial Bus (USB) memory, a Secure Digital (SD), a mini Secure Digital (mSD) card, a micro SD, a high-capacity Secure Digital High Capacity (SDHC), a memory stick card (MSC), a Smart Media (SM) card, a Multi Media Card (MMC), an Embedded MMC (eMMC), a Compact Flash (CF) card, etc.

As described above, the gate over the fin structure in the peripheral region is applied to a cell transistor of the buffer memory 830 for use in the electronic device 800, such that operation characteristics of transistors formed in the peripheral region are improved and the short channel effects are also reduced, resulting in improved operation characteristics of the electronic device.

Figure 9:
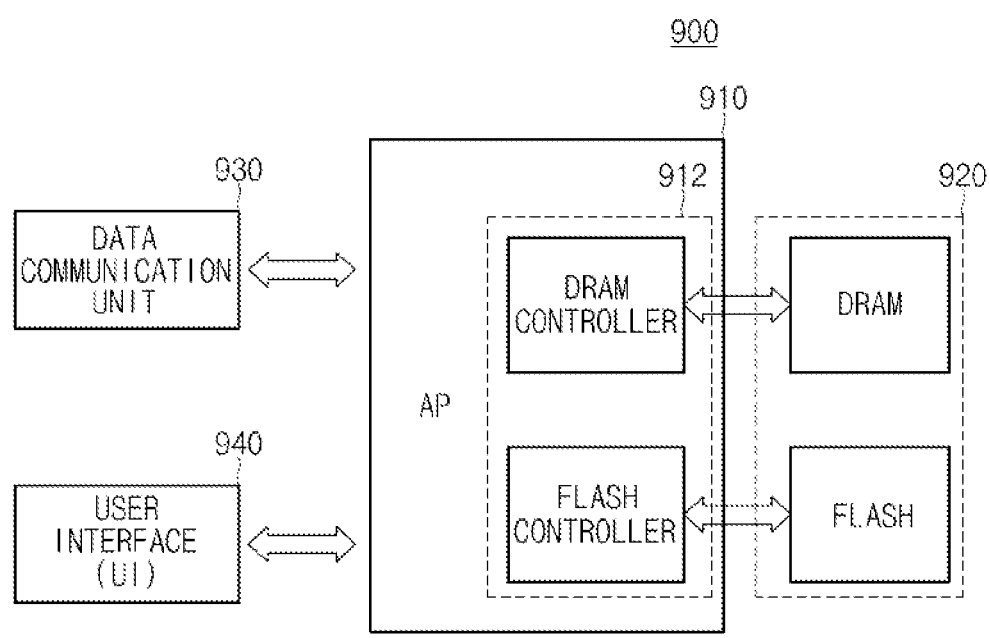
FIG. 9 is a block diagram illustrating an electronic device according to another embodiment.

FIG. 9 is a block diagram illustrating an electronic device according to another embodiment.

Referring to FIG. 9, the electronic device 900 may include an application processor 910, a memory device 920, a data communication unit 930, and a user interface (UI) 940.

The application processor 910 may provide overall control to the electronic device 900, and may be configured to control and adjust a series of operations for processing data in response to an input command received through the user interface (UI) 940 and outputting the processed result. The application processor 910 may be implemented as a multi-core processor so as to perform multi-tasking. Specifically, the application processor 910 may include an SoC-shaped memory controller 912 for controlling data I/O operations of the memory device 920. Here, the memory controller 912 may include not only a first controller for controlling a volatile memory (for example, DRAM) but also a second controller for controlling a non-volatile memory (for example, flash memory). The memory controller 912 may include the memory controller 610 shown in FIG. 6.

Upon receiving a control signal from the memory controller 912, the memory device 920 may store data requisite for operating the electronic device 900, read the stored data, and output the read data to the memory controller 912. The memory device 920 may include a volatile memory and a non-volatile memory. Specifically, the memory device 920 may include a plurality of memory cells for storing data therein.

The data communication unit 930 may be configured to perform data communication between the application processor 910 and the external device according to a predefined communication protocol. The data communication unit 930 may include a module coupled to a wired network and a module coupled to a wireless network. The wired network module may include a Local Area Network (LAN), a Universal Serial Bus (USB), an Ethernet, a Power Line Communication (PLC), etc. The wireless network module may include Infrared Data Association (IrDA), Code Division Multiple Access (CDMA), Time Division Multiple Access (TDMA), Frequency Division Multiple Access (FDMA), Wireless LAN (WLAN), Zigbee, Ubiquitous Sensor Network (USN), Bluetooth, Radio Frequency Identification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), etc.

The user interface (UI) 940 may provide an interface between a user and the portable electronic device 900 so that the user can input data to the portable electronic device 900. The user interface (UI) 940 may include user I/O devices for informing the user of audio or video signals indicating the processed result of the portable electronic device 900. For example, the user interface (UI) 940 may include a button, a keypad, a display (screen), a speaker, etc. incorporated into the electronic device 900.

The above-mentioned electronic device 900 may be implemented as a handheld device, for example, a mobile phone, a smartphone, a tablet computer, a personal digital assistant (PDA), an enterprise digital assistant (EDA), a digital still camera, a digital video camera, a portable multimedia player (PMP), a personal navigation device or a portable navigation device (PND), a handheld game console, or an e-book. In addition, the electronic device 900 may be implemented as an embedded system for performing a specific function of vehicles or ships.

As described above, the gate over the fin structure in the peripheral region is applied to a cell transistor of the memory device 920 for use in the electronic device 900, such that operation characteristics of transistors formed in the peripheral region are improved and the short channel effects are also reduced, resulting in improved operation characteristics of the electronic device.

Figure 10:
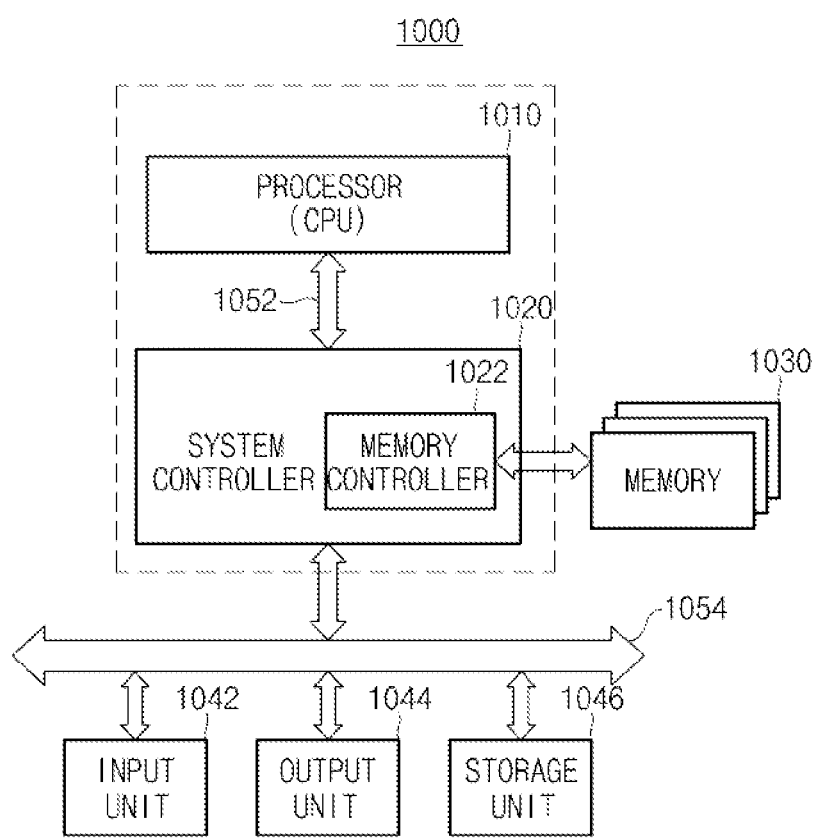
FIG. 10 is a block diagram illustrating an electronic device according to another embodiment.

FIG. 10 is a block diagram illustrating an electronic device according to another embodiment.

Referring to FIG. 10, the electronic device 1000 may include a processor 1010 such as a CPU, a system controller 1020, and a memory device 1030. The electronic device 1000 may further include an input unit 1042, an output unit 1044, a storage unit 1046, a processor bus 1052, and an extended bus 1054.

The processor 1010 may provide overall control to the electronic device 1000, and may be configured to control and adjust a series of operations for processing (or calculating) data (or command) received through the input unit 1042 and outputting the processed result to the output unit 1044. The processor 1010 may include a general Central Processing Unit (CPU) or Micro Controller Unit (MCU). The processor 1010 may be coupled to the system controller 1020 through the processor bus 1052 including an address bus, a control bus, and/or a data bus. The system controller 1020 may be coupled to the extended bus 1054 such as a Peripheral Component Interconnection (PCI). Accordingly, the processor 1010 may enable the system controller 1020 to control the input unit 1042 such as a keyboard or mouse, the output unit 1044 such as a printer or display, and the storage unit 1046 such as HDD, SSD, or CDROM. The processor 1010 may be implemented as a multi-core processor.

The system controller 1020 may control data communication between the memory device 1030 and the peripheral devices (1042, 1044, 1046) upon receiving a control signal of the processor 1010. The system controller 1020 may include a memory controller 1022 for controlling data I/O operations of the memory device 1030. In this case, the memory controller 1022 may include the memory controller 610 of FIG. 6. The system controller 1020 may include a Memory Controller Hub (MCH) and I/O Controller Hub (ICU) of Intel Corporation. Although the system controller 1020 and the processor 1010 shown in FIG. 10 are separated from each other for convenience of description, the system controller 1020 may be embedded in the processor 1010 or may be incorporated with the processor 1010 into a single SoC-shaped chip. Alternatively, only the memory controller 1022 of the system controller 1020 may be embedded in the processor 1010, or may be fabricated in the form of an SoC such that the SoC-shaped memory controller 1022 may be contained in the processor 1010.

The memory device 1030 may store data received from the memory controller 1022 upon receiving a control signal from the memory controller 1022, read the stored data, and output the read data to the memory controller 1022. The data storage unit 810 may include the memory device 610 shown in FIG. 6.

The storage unit 1046 may store data to be processed by the electronic device 1000. The storage unit may include a data storage unit embedded in the computing system or an external storage unit, and may include the memory system 800 shown in FIG. 8.

The electronic system 1000 may be any one of a variety of electronic systems operated by a variety of processes, for example, a personal computer, a server, a Personal Digital Assistant (PDA), a Portable Computer, a Web Tablet, a Wireless Phone, a mobile phone, a smart phone, a digital music player, a Portable Multimedia Player (PMP), an Enterprise Digital Assistant (EDA), a digital still camera, a digital video camera, a Global Positioning System (GPS), a voice recorder, a Telematics, an Audio Visual (AV) System, a Smart Television, other embedded systems, etc.

As described above, the gate over the fin structure in the peripheral region is applied to a cell transistor of the memory device 1030 for use in the electronic device 1000, such that operation characteristics of transistors formed in the peripheral region are improved and the short channel effects are also reduced, resulting in improved operation characteristics of the electronic device.

As is apparent from the above description, according to an embodiment of a semiconductor device and a method for forming the same, a semiconductor substrate in a peripheral region is etched to form a plurality of holes. A gap-filling material is buried in the holes of the semiconductor substrate in the peripheral region, and first and second device isolation films are formed in the semiconductor device. A fin structure is formed by recessing the buried gap-filling material to a predetermined depth, and a gate is formed over an entire surface including the fin structure. In these embodiments, operation characteristics of transistors formed in the peripheral region are improved and the short channel effects are also reduced.

The above-described embodiments of the present disclosure are illustrative and not restrictive. Various alternatives and equivalents are possible. These embodiments are not limited by a type of deposition, etching, polishing, and patterning steps described herein. Nor are embodiments of the present disclosure limited to any specific type of semiconductor device. For example, embodiments of the present disclosure may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   an active region disposed in a semiconductor substrate of a peripheral region;
   one or more first device isolation regions disposed in the active region;
   a second device isolation region defining the active region;
   a fin-type active region that includes divided portions of the active region defined by the one or more first device isolation regions;
   an insulation film filling the first and second device isolation regions; and
   a gate disposed over the fin-type active region,
   wherein a top surface of the insulation film is disposed below top surfaces of the fin-type active region.

2. The semiconductor device according to claim 1, wherein the second device isolation region has a larger width than a first width of the first device isolation regions, the first width of the first device isolation regions being parallel to the width of the second device isolation region.

3. The semiconductor device according to claim 1, wherein the first device isolation regions each have an island shape.

4. The semiconductor device according to claim 1, wherein the insulation film in the first device isolation regions has a laminate structure of a sidewall oxide film and a liner insulation film, and wherein the liner insulation film comprises a nitride film.

5. The semiconductor device according to claim 1, wherein the insulation film in the second device isolation region has a laminate structure of a sidewall oxide film, a liner insulation film, and a Spin On Dielectric (SOD) film, and wherein the liner insulation film comprises a nitride film.

6. The semiconductor device according to claim 1, wherein the gate is disposed over the insulation film in the first device isolation regions and the fin-type active region, and wherein the gate has a line shape.

7. The semiconductor device according to claim 1, further comprising:
   a plurality of contact plugs disposed near both sides of the gate outside the fin-type active region.

8. The semiconductor device according to claim 1, wherein a width of the gate is larger than a second width of the first device isolation regions.

9. An electronic device comprising:
   a memory device configured to store data and read the stored data in response to a data input/output (I/O) control signal; and
   a memory controller configured to generate the data I/O control signal, and control data I/O operations of the memory device,
   wherein the memory device includes:
      an active region disposed in a semiconductor substrate of a peripheral region;
      one or more of first device isolation regions disposed in the active region;
      a second device isolation region defining the active region;
      a fin-type active region that includes divided portions of the active region defined by the one or more first device isolation regions;
      an insulation film filling the first and second device isolation regions; and
      a gate disposed over the fin-type active region, and
   wherein a top surface of the insulation film is disposed below top surfaces of the fin-type active region.

10. The electronic device according to claim 9, further comprising:
    a processor configured to store data in the memory device by controlling the memory controller, and perform calculation corresponding to an external input command using data stored in the memory device.

11. The electronic device according to claim 10, wherein the memory controller and the processor are fabricated in a System on Chip (SoC) shape.

12. The electronic device according to claim 9, wherein the second device isolation region has a larger width than a first width of the first device isolation regions, the first width of the first device isolation regions being parallel to the width of the second device isolation region.

13. The electronic device according to claim 9, wherein the first device isolation regions each have an island shape.

14. The electronic device according to claim 9, wherein the insulation film in the first device isolation regions has a laminate structure of a sidewall oxide film and a liner insulation film, and wherein the liner insulation film comprises a nitride film.

15. The electronic device according to claim 9, wherein the insulation film in the second device isolation region has a laminate structure of a sidewall oxide film, a liner insulation film, and a Spin On Dielectric (SOD) film, and wherein the liner insulation film comprises a nitride film.

16. The electronic device according to claim 9, wherein the gate is disposed over the insulation film in the first device isolation regions and the fin-type active region, and wherein the gate has a line shape.

17. The electronic device according to claim 9, further comprising:
   a plurality of contact plugs disposed near both sides of the gate outside the fin-type active region.

18. The electronic device according to claim 9, wherein a width of the gate is larger than a second width of the first device isolation regions.

19. The semiconductor device according to claim 1, wherein the insulation film in the first device isolation regions has a laminate structure of a sidewall oxide film and a liner insulation film, wherein the liner insulation film fills an entire space defined by a portion of the sidewall oxide film that is disposed over sidewall surfaces of two adjacent divided portions of the active region, and wherein the liner insulation film comprises a nitride film.

20. The semiconductor device according to claim 9, wherein the insulation film in the first device isolation regions has a laminate structure of a sidewall oxide film and a liner insulation film, wherein the liner insulation film fills an entire space defined by a portion of the sidewall oxide film that is disposed over sidewall surfaces of two adjacent divided portions of the active region, and wherein the liner insulation film comprises a nitride film.

* * * * *